United States Patent
Asahata et al.

(10) Patent No.: US 9,190,243 B2
(45) Date of Patent: Nov. 17, 2015

(54) COMPOSITE CHARGED PARTICLE BEAM APPARATUS AND THIN SAMPLE PROCESSING METHOD

(71) Applicant: HITACHI HIGH-TECH SCIENCE CORPORATION, Tokyo (JP)

(72) Inventors: Tatsuya Asahata, Tokyo (JP); Hidekazu Suzuki, Tokyo (JP); Shota Torikawa, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/012,019

(22) Filed: Aug. 28, 2013

(65) Prior Publication Data

US 2014/0061159 A1   Mar. 6, 2014

(30) Foreign Application Priority Data

Aug. 30, 2012 (JP) ................................. 2012-190490
Aug. 26, 2013 (JP) ................................. 2013-174802

(51) Int. Cl.
    *H01J 37/30*  (2006.01)
    *H01J 37/02*  (2006.01)
    *H01J 37/20*  (2006.01)
    *H01J 37/28*  (2006.01)

(52) U.S. Cl.
    CPC ............. *H01J 37/3005* (2013.01); *H01J 37/02* (2013.01); *H01J 37/20* (2013.01); *H01J 37/28* (2013.01); *H01J 2237/20207* (2013.01); *H01J 2237/28* (2013.01); *H01J 2237/3174* (2013.01); *H01J 2237/31745* (2013.01); *H01J 2237/31749* (2013.01)

(58) Field of Classification Search
    CPC ............ H01J 37/20; H01J 2237/20207; H01J 2237/3174; H01J 2237/31745; H01J 2237/31749; G01N 1/06; G01N 1/28
    USPC ............. 250/442.11, 304, 307, 310, 311, 309
    See application file for complete search history.

(56) References Cited

U.S. PATENT DOCUMENTS

| | | | |
|---|---|---|---|
| 8,642,958 B2 * | 2/2014 | Takahashi et al. | 250/310 |
| 2005/0236587 A1 * | 10/2005 | Kodama et al. | 250/492.21 |
| 2007/0045560 A1 | 3/2007 | Takahashi et al. | 250/442.11 |

FOREIGN PATENT DOCUMENTS

JP          2007066710          3/2007

* cited by examiner

*Primary Examiner* — Jack Berman
(74) *Attorney, Agent, or Firm* — Adams & Wilks

(57) ABSTRACT

A composite charged particle beam apparatus includes a FIB column for irradiating a thin sample with a FIB and a GIB column for irradiating the thin sample with a GIB. The thin sample is placed on a sample stage, and a tilt unit tilts the thin sample about a tilt axis of the sample stage, the tilt axis being orthogonal to the FIB irradiation axis and being located inside a plane formed by the FIB irradiation axis and the GIB irradiation axis. A tilt sample holder is mounted on the sample stage and fixes the thin sample such that a cross-sectional surface of the thin sample is tilted at a constant angle with respect to the GIB irradiation axis and the azimuth angle of the GIB column can be changed by rotation of the sample stage.

5 Claims, 13 Drawing Sheets

COMPOSITE CHARGED PARTICLE BEAM APPARATUS AND THIN SAMPLE PROCESSING METHOD

CROSS-REFERENCE TO RELATED APPLICATIONS

The present application claims priority from Japanese Patent Application No. 2012-190490 filed on Aug. 30, 2012 and Japanese Patent Application No. 2013-174802 filed on Aug. 26, 2013, the contents of which are incorporated herein by reference.

BACKGROUND

1. Technical Field

The present invention relates to a composite charged particle beam apparatus for preparing a thin sample by using an ion beam.

2. Related Art

There has been proposed a technology of preparing a thin sample used for transmission electron microscope (TEM) observation by using a focused ion beam (FIB) apparatus. Further, it has been known that gallium, which is an ion species, is injected to the thin sample by irradiation of the Focused Ion Beam so that a damage layer is formed.

In recent years, as means for removing the damaged layer, finishing processing has been proposed in which the thin sample is irradiated with a gas ion beam (GIB) and the damaged layer is removed (refer to JP-A-2007-066710).

According to such means, it is possible to form the thin sample having fewer damaged layers.

SUMMARY

In the above-described related art, in a case where a structure such as a semiconductor device is exposed to an observation surface of a thin sample, since an etching rate of a gas ion beam varies depending on presence or absence of the structure, a phenomenon where convex-concave portions are formed on the observation surface to cause a streak to appear, so-called a curtain effect may occur. Therefore, there is a problem that in an observation image of the observation surface, the streak formed by ion beam processing may appear in a structure in addition to an original device structure.

In particular, various types of materials are used for an advanced device in recent years. Thus, in some cases, a difference in the etching rate is remarkable.

Further, since the advanced device has a fine structure, an observation object is also fine. Accordingly, there has been a problem that even small convex-concave portions appearing on the observation surface may affect observation.

Therefore, illustrative aspects of the present invention provide a composite charged particle beam apparatus which can suppress the curtain effect and obtain the observation image having fewer streaks formed by the ion beam processing.

According to one illustrative aspect of the present invention, there is provided a composite charged particle beam apparatus, comprising: a first charged particle beam column configured to irradiate a thin sample with a first charged particle beam; a second charged particle beam column configured to irradiate an irradiation position of the first charged particle beam of the thin sample with a second charged particle beam; a sample stage on which the thin sample is placed; a first tilt unit configured to tilt the thin sample about a first tilt axis of the sample stage, the first tilt axis being orthogonal to an irradiation axis of the first charged particle beam column and being located inside a plane formed by the irradiation axis of the first charged particle beam column and the irradiation axis of the second charged particle beam column; and a second tilt unit configured to tilt the thin sample about an axis orthogonal to the irradiation axis of the first charged particle beam column and the first tilt axis.

The second tilt unit may be a tilt sample holder configured to fix the thin sample such that a cross-sectional surface of the thin sample is tilted at a constant angle with respect to a direction of the irradiation axis of the second charged particle beam.

The tilt sample holder may be attachable to and detachable from the sample stage.

The second tilt unit may be a tilt mechanism for tilting the thin sample about the axis orthogonal to the irradiation axis of the first charged particle beam column and the first tilt axis.

The composite charged particle beam apparatus may further comprise: a display unit configured to display an operation condition and an observation image of the thin sample; an input unit configured to allow an operator to input information about the operation condition; and a control unit configured to control the composite charged particle beam apparatus on the basis of the information input to the input unit.

According to another illustrative aspect of the present invention, there is provided a thin sample processing method comprising: forming a cross-sectional surface on a thin sample by irradiating the thin sample with a first charged particle beam; performing first finishing processing by irradiating the cross-sectional surface with a second charged particle beam from an upper surface side of the thin sample; tilting the thin sample; and performing second finishing processing by irradiating the cross-sectional surface with the second charged particle beam from the upper surface side after the thin sample is tilted.

The thin sample processing method may further comprise observing the cross-sectional surface by using SEM observation during the performing the first finishing processing and the second finishing processing.

The tilting the thin sample may comprise tilting the thin sample about a tilt axis of a sample stage on which the thin sample is placed, the tilt axis being orthogonal to an irradiation axis of the first charged particle beam and being located inside a plane formed by the irradiation axis of the first charged particle beam and an irradiation axis of the second charged particle beam.

The tilting the thin sample may comprise tilting the thin sample about a second tilt axis which is orthogonal to an irradiation axis of the first charged particle beam and a first tilt axis of the sample stage on which the thin sample is placed, the first tilt axis being orthogonal to the irradiation axis of the first charged particle beam and being located inside a plane formed by the irradiation axis of the first charged particle beam and an irradiation axis of the second charged particle beam.

Here, the first charged particle beam and the second charged particle beam may be a focused ion beam and a gas ion beam, respectively, or the gas ion beam and the focused ion beam, respectively.

Alternatively, the first charged particle beam and the second charged particle beam may be the focused ion beam accelerated by a high acceleration voltage and the focused ion beam accelerated by a low acceleration voltage.

The thin sample processing method may further comprise: receiving conditions relating to the step of forming the cross-sectional surface on the thin sample, the step of the first finishing processing, the step of tilting the thin sample, and the second finishing processing by a control unit; and controlling a composite charged particle beam apparatus to perform the thin sample processing method on the basis of the received conditions.

A program for implementing such a control may be incorporated in the inside of the composite charged particle beam apparatus, or may be stored in an external storage device.

According to the illustrative aspects of the present invention, even when a sample having a structure such as a semiconductor device is more thinned, it is possible to suppress a curtain effect due to finishing processing and to obtain an observation image with reducing streaks formable by ion beam processing.

BRIEF DESCRIPTION OF THE DRAWINGS

FIGS. 4A to 4D are explanatory views of a thin sample processing method of a first exemplary embodiment, in which: FIG. 4A illustrates arrangement of each column and a sample stage on a second plane; FIG. 4B illustrates arrangement of each column and a sample stage on a first plane in a state of FIG. 4A; FIG. 4C illustrates arrangement of each column and a sample stage on a second plane after being tilted; and FIG. 4D illustrates arrangement of each column and a sample stage on a first plane in a state of FIG. 4C;

FIGS. 5A to 5D are explanatory views of a thin sample processing method of a another example of the first exemplary embodiment, in which: FIG. 5A illustrates an arrangement state so that a cross-sectional surface of a thin sample may be irradiated by an EB; FIG. 5B illustrates arrangement of each column and a sample stage on the first plane in a state of FIG. 5A; FIG. 5C illustrates arrangement of each column and a sample stage on the second plane after being tilted; and FIG. 5D illustrates arrangement of each column and a sample stage on the first plane in a state of FIG. 5C;

FIGS. 6A to 6D are explanatory views of a thin sample processing method of another example of the first exemplary embodiment, in which: FIG. 6A illustrates arrangement of a thin sample on a sample stage when viewed from an irradiation direction of an FIB; FIG. 6B illustrates arrangement of each column and a sample stage on the first plane in a state of FIG. 6A: FIG. 6C illustrates arrangement of a sample stage after being tilted, when viewed from an irradiation direction of an FIB; and FIG. 6D illustrates arrangement of each column and a sample stage on the first plane in a state of FIG. 6C;

FIGS. 8A to 8D are explanatory views of a thin sample processing method of a second exemplary embodiment, in which: FIG. 8A illustrates arrangement of each column and a sample stage on the second plane; FIG. 8B illustrates arrangement of each column and a sample stage on the first plane in a state of FIG. 8A; FIG. 8C illustrates arrangement of each column and a sample stage on the second plane after being tilted; and FIG. 8D illustrates arrangement of each column and a sample stage on the first plane in a state of FIG. 8C;

FIGS. 9A to 9D are explanatory views of a thin sample processing method of a another example of the second exemplary embodiment, in which: FIG. 9A illustrates arrangement of each column and a sample stage on the second plane; FIG. 9B illustrates arrangement of each column and a sample stage on the first plane in a state of FIG. 9A; 9C illustrates arrangement of each column and a sample stage on the second plane after being tilted; and FIG. 9D illustrates arrangement of each column and sample stage on the first plane in a state of FIG. 9C;

FIGS. 10A and 10B are explanatory views of an incidence angle and an azimuth angle, in which FIG. 10A illustrates the incidence angle, and FIG. 10B illustrates the azimuth angle;

FIGS. 12A and 12B are explanatory views of a thin sample processing method of a third exemplary embodiment, in which FIG. 12A is the same view as FIG. 8B, and FIG. 12B illustrates a state where a sample stage is rotated by 90 degrees from a state of FIG. 12A.

DETAILED DESCRIPTION

Hereinafter, exemplary embodiments of a composite charged particle beam apparatus according to the present invention will be described.

Figure 1:
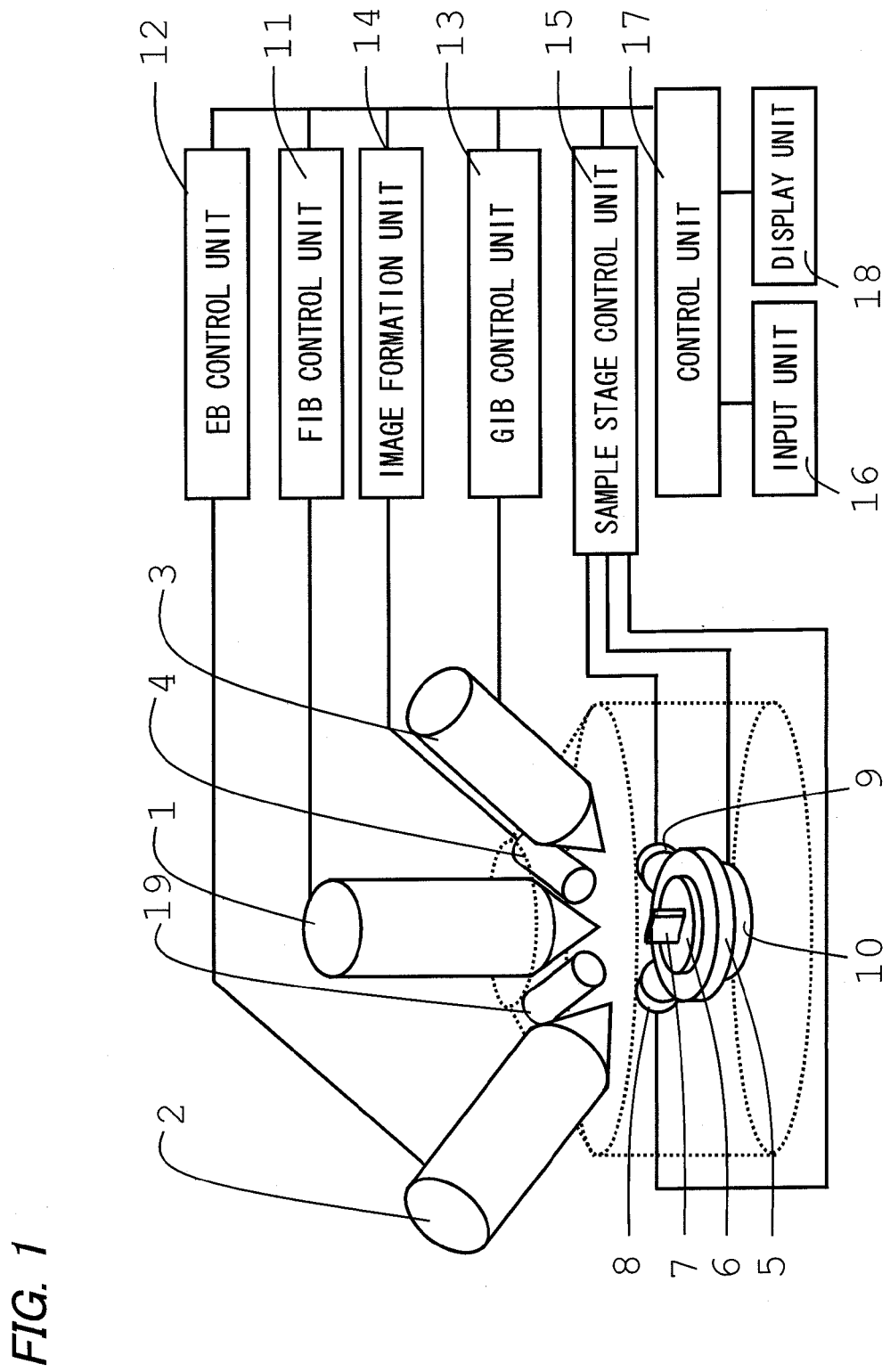
FIG. 1 is a configuration view of a composite charged particle beam apparatus according to the present invention.

The composite charged particle beam apparatus according to the present exemplary embodiment, as illustrated in FIG. 1, includes an FIB column 1 configured to irradiate an FIB, an EB column 2 configured to irradiate an electron beam (EB) and a GIB column 3 configured to irradiate a gas ion beam.

The FIB column 1 includes a liquid metal ion source. The GIB column 3 includes a PIG type gas ion source. The gas ion source employs helium, argon, xenon and oxygen as an ion source gas.

The composite charged particle beam apparatus further includes a secondary electron detector 4 for detecting a secondary electron generated from a thin sample 7 by irradiation, of the EB, the FIB or the GIB. A reflected electron detector for detecting a reflected electron generated from the thin sample 7 by the irradiation of the EB may be provided.

The composite charged particle beam apparatus further includes a sample holder 6 for fixing the thin sample 7 and a sample stage 5 on which the sample holder 6 is placed. The sample stage 5 is movable in three axial directions of XYZ and may be tilted and rotated about axes of a tilt axis and a rotation axis respectively. That is, an azimuth angle of the GIB with respect to the thin sample 7 (see FIG. 10B) may be changed by tilting the sample stage 5. Under command of a sample stage control unit 15, the sample stage 5 is controlled by a sample stage drive unit 10. A main role of the sample stage drive unit 10 is a rotary operation of the sample stage 5, and details thereof will be described in a third exemplary embodiment.

The composite charged particle beam apparatus further includes an FIB control unit 11, an EB control unit 12, a GIB control unit 13, an image formation unit 14 and a display unit 18. The EB control unit 12 is configured to control EB irradiation from the EB column 2. The FIB control unit 11 is configured to control FIB irradiation from the FIB column 1. The GIB control unit 13 is configured to control GIB irradiation from the GIB column 3. The image formation unit 14 is configured to form an SEM image by using a signal for scanning the EB and a signal of a secondary electron detected by the secondary electron detector 4. The display unit 18 may display an observation image such as the SEM image, various control conditions of the composite charged particle beam apparatus, etc. Further, the image formation unit 14 is configured to form an SIM image by using a signal for scanning the FIB and the signal of the secondary electron detected by the secondary electron detector 4. The display unit 18 may display the SIM image.

The composite charged particle beam apparatus further includes an input unit 16 and a control unit 17. An operator inputs conditions relating to a device control to the input unit 16. The input unit 16 transmits the input information to the control unit 17. The control unit 17 transmits a control signal to the FIB control unit 11, the EB control unit 12, the GIB control unit 13, the image formation unit 14, the sample stage control unit 15 or the display unit 18, thereby controlling the device.

With regard to a control of the device, for example, the operator sets an irradiation region of the FIB or the GIB, on the basis of the observation image such as the SEM image or the SIM image displayed on the display unit 18. The operator inputs a processing frame for setting the irradiation region on the observation image displayed on the display unit 18, through the input unit 16. Further, in response to the operator inputting a command to start processing to the input unit 16, the irradiation region and the signal to start the processing are transmitted from the control unit 17 to the FIB control unit 11 or the GIB control unit 13. Then, a specified irradiation region of the thin sample 7 is irradiated by the FIB from the FIB control unit 11, or by the GIB from the GIB control unit 13. In this manner, the irradiation region input by the operator can be irradiated by the FIB or the GIB.

Further, the composite charged particle beam apparatus includes a gas gun 19 for supplying an etching gas to the vicinity of the irradiation region of the EB, the FIB or the GIB to the thin sample 7. As the etching gas, a chlorine gas, a fluorine gas (xenon fluoride and fluorocarbon) and a halogen gas such as an iodine gas are used. Gas-assisted etching using the EB, the FIB and the GIB may be performed by using the etching gas which reacts with materials of the thin sample 7. Specifically, in the gas-assisted etching using the EB, the etching processing may be performed without giving damage caused by ion sputtering to the thin sample 7.

Figure 2:
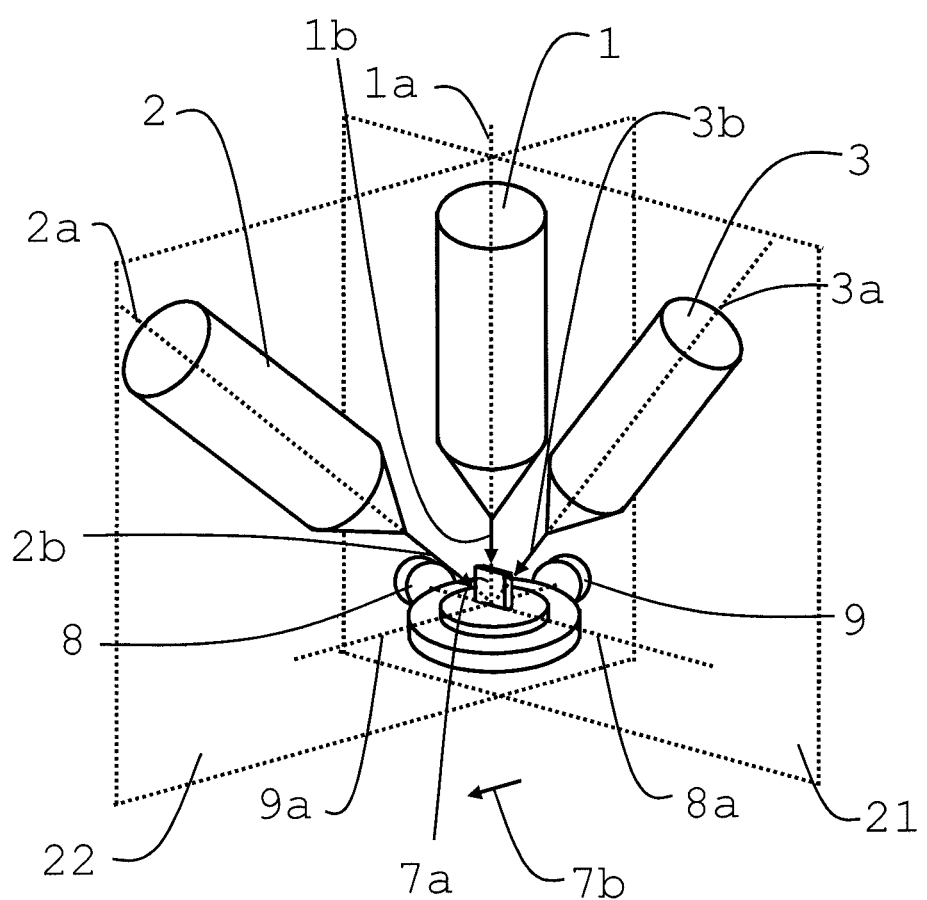
FIG. 2 is a configuration view of a composite charged particle beam apparatus according to the present invention.

Next, arrangement of a tilt axis of each column and a sample stage will be described with reference to FIG. 2. In order to perform SEM observation of the thin sample 7 in processing by using FIB 1b or GIB 3b, an FIB irradiation axis 1a of the FIB column 1, an EB irradiation axis 2a of the EB column 2, and a GIB irradiation axis 3a of the GIB column 3 are arranged so as to intersect with each other on the thin sample 7 whose position is adjusted by moving the sample stage 5.

The sample stage 5 may be tilted by a first tilt drive unit 8 about a first tilt axis 8a, which is orthogonal to the FIB irradiation axis 1a and is located inside a first plane 21 formed by the FIB irradiation axis 1a and the GIB irradiation axis 3a. In a case where the thin sample 7 is arranged such that a film thickness direction 7b is orthogonal to the first tilt axis 8a and the thin sample 7 is tilted by the first tilt drive unit 8, a cross-sectional surface 7a can be perpendicularly irradiated by the FIB 1b or the EB 2b, and thus, SIM or SEM observation of the cross-sectional surface 7a can be performed.

Further, when there is provided a second tilt mechanism for tilting the sample stage 5 about a second tilt axis 9a, the sample stage 5 may be tilted by a second tilt drive unit 9 about the second tilt axis 9a that is orthogonal to the FIB irradiation axis 1a and the first tilt axis 8a. Here, the second tilt axis 9a is located inside a second plane 22 formed by the FIB irradiation axis 1a and the EB irradiation axis 2a. According to this configuration, even when the thin sample 7 is arranged such that the cross-sectional surface 7a is irradiated by EB 2b to enable the SEM observation, the second tilt drive unit 9 may irradiate the FIB 1b or GIB 3b from two different directions. That is, the FIB 1b or the GIB 3b enables the SEM observation of the cross-sectional surface 7a during the processing. Accordingly, since the processing may be completed by performing the SEM observation to detect a processing completion point, it is possible to suppress a curtain effect of the cross-sectional surface 7a and to complete the processing when a desired structure or a defect is exposed to the cross-sectional surface 7a.

Figure 3:
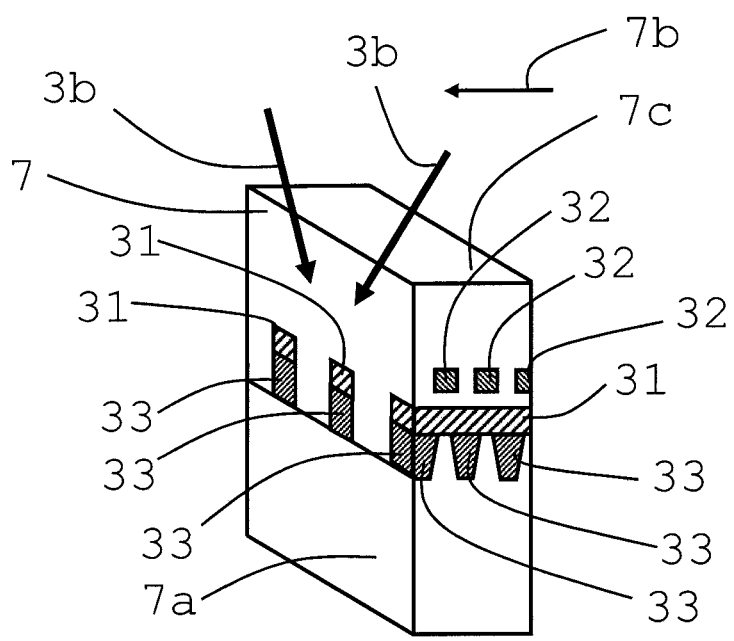
FIG. 3 is a schematic view of a thin sample according to the present invention.

FIG. 3 is a schematic view of the thin sample 7 in which a portion of a semiconductor device is cut out. The thin sample 7 has structures 31, 32 and 33 of the device. The structures 31 and 33 are exposed on the cross-sectional surface 7a.

If such a cross-sectional surface is irradiated by the ion beam from one direction, an etching rate is different between a portion having the structure and a portion without the structure. Thus, convex-concave portions are formed on the cross-sectional surface. If the cross-sectional surface having the convex-concave portions is observed using the SEM observation, a streak caused by the convex-concave portions is included in an observation image. Since the streak is formed by ion beam processing, the streak is not a structure or a defect of the semiconductor device. If the streak appears on the observation image, in some cases, the structure and the defect of the semiconductor device cannot be distinguished from each other.

Accordingly, by adopting a configuration where the thin sample 7 is subjected to finishing processing in such a manner that the thin sample is tilted with respect to the GIB 3b and the cross-sectional surface 7a is irradiated with the GIB 3b in two or more different directions from an upper surface 7c side of the thin sample 7 for finishing processing, the convex-concave portions generated in the etching processing using the GIB 3b from one direction are subjected to the etching processing using the GIB 3b from the other direction. Therefore, it is possible to suppress the convex-concave portions from being formed due to the structure of the device which is exposed on the cross-sectional surface 7a.

In the above description, the FIB column 1 is arranged in the vertical direction, but may be arranged by replacing the FIB column 1 with the EB column 2.

Further, in the above description, the thin sample 7 is subjected to the finishing processing by using the GIB 3b, but instead of the GIB 3b, gas-assisted etching by using the EB 2b or the FIB 1b may be used. When using the FIB 1b, it is preferable to change beam energy of the FIB 1b in the processing for forming the cross-sectional surface 7a of the thin sample 7 and the finishing processing. That is, in the processing for forming the cross-sectional surface 7a of the thin sample 7, a sharp cross-sectional surface is formed very fast by using the FIB 1b, in which an acceleration voltage is accelerated from 30 kV to 40 kV, and by using a beam having a small beam diameter. In the finishing processing, processing having less damage is performed by using the FIB 1b having low acceleration in which the acceleration voltage is approximately from 1 kV to 10 kV, and by using a beam with a small penetration length to the thin sample 7. In this manner, it is possible to perform the finishing processing having less damage.

First Exemplary Embodiment

An exemplary embodiment will be described in which the thin sample 7 is processed by using the composite charged particle beam apparatus provided with the above-described second tilt mechanism.

Figure 4A:
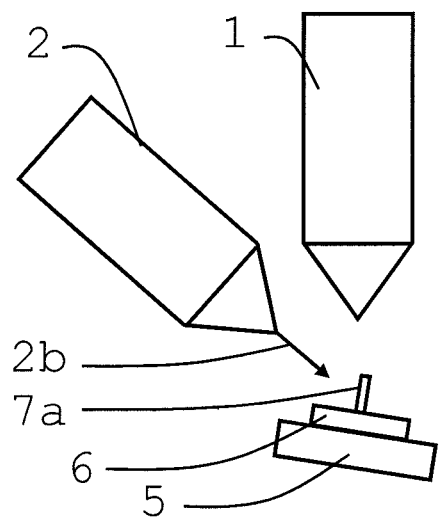
Figure 4B:
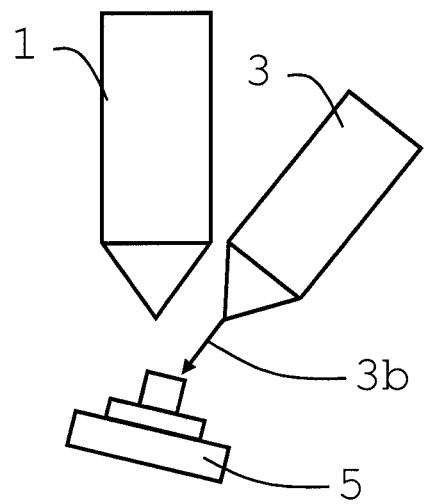

Referring to FIGS. 4A to 4D, a processing method will be described in which an azimuth angle of the GIB 3b is changed by tilting the sample stage 5 about the second tilt axis 9a. FIG. 4A illustrates arrangement of each column and the sample stage 5 on the second plane 22. FIG. 4B illustrates the arrangement of each column and the sample stage 5 on the first plane 21 at this time.

First, the cross-sectional surface 7a is formed on the thin sample 7 by using the FIB 1b. Then, the thin sample 7 is arranged so as to enable the cross-sectional surface 7a to be irradiated with the EB 2b. Then, the cross-sectional surface 7a is irradiated with the GIB 3b, and is subjected to the etching processing (first finishing processing). The cross-sectional surface 7a is irradiated with the EB 2b during the processing using GIB 3b, and then, the SEM observation is performed.

Figure 4C:
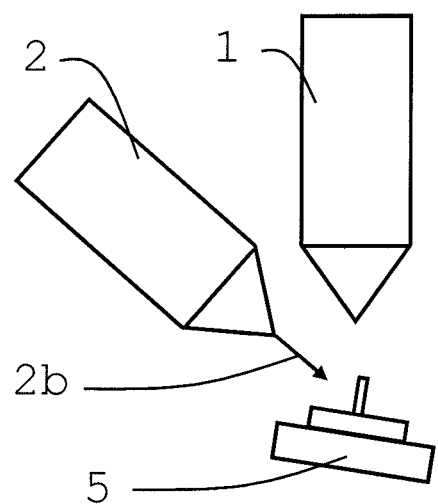
Figure 4D:
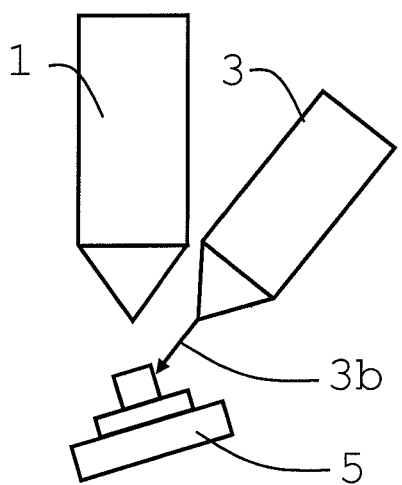

Then, the sample stage 5 is tilted about the second tilt axis 9a. FIG. 4C illustrates the arrangement of each column and the sample stage 5 on the second plane 22 after being tilted, and FIG. 4D illustrates the arrangement of each column and the sample stage 5 on the first plane 21 at this time. Since the sample stage 5 is tilted about the second tilt axis 9a, only the arrangement on the first plane 21 is changed. In a tilted state, the cross-sectional surface 7a is irradiated with the GIB 3b and is subjected to the etching processing (second finishing processing). The cross-sectional surface 7a is observed by using the SEM observation during the processing using the GIB 3b. The processing is completed when a desired structure or a defect is exposed to the cross-sectional surface 7a.

According to this configuration, the cross-sectional surface 7a may be irradiated with the GIB 3b from a direction different from the direction before being tilted. Therefore, it is possible to suppress the convex-concave portions from being formed due to the structure of the device which is exposed on the cross-sectional surface 7a. Further, since the incidence angle of the EB 2b with respect to the cross-sectional surface 7a is not changed before and after being tilted, even in high magnification SEM observation for observing a fine device structure or defect as an observation object, it is not necessary to adjust a position for the SEM observation before and after being tilted. Accordingly, it is possible to efficiently perform the processing.

Figure 5A:
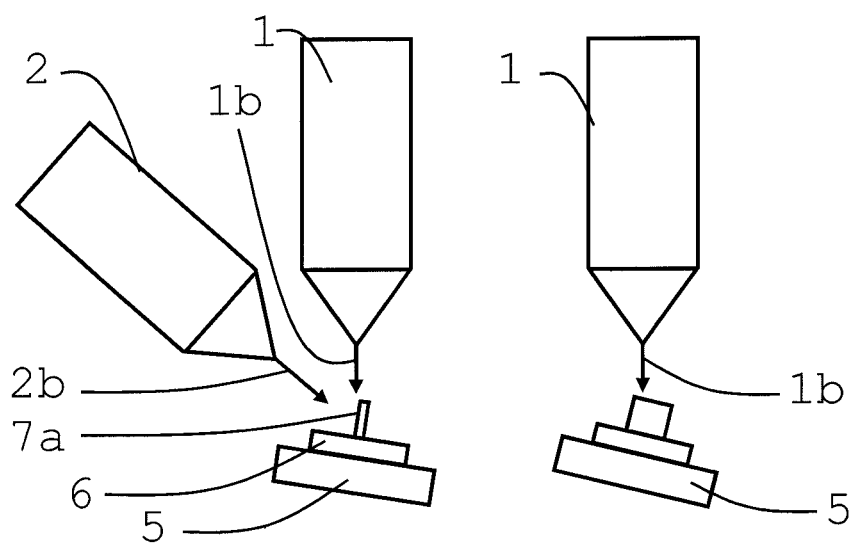
Figure 5B:
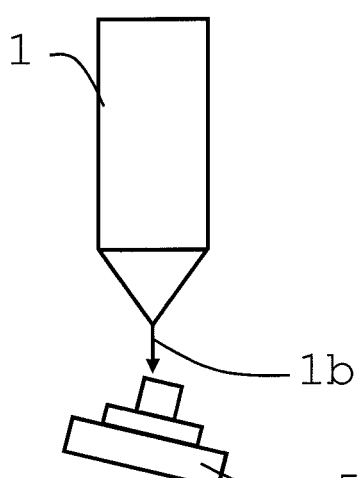

Here, instead of the GIB 3b, the FIB 1b may be used in the finishing processing. In this case, the cross-sectional surface 7a is first formed on the thin sample 7 by using the FIB 1b in which the acceleration voltage is accelerated from 30 kV to 40 kV. Then, as illustrated in FIG. 5A, the cross-sectional surface 7a of the thin sample 7 is arranged so as to enable the irradiation of the EB 2b. FIG. 5B illustrates the arrangement of each column and the sample stage 5 on the first plane 21 at this time. Then, the cross-sectional surface 7a is subjected to the etching processing by switching the acceleration voltage from 1 kV to 10 kV, and by the irradiation of the FIB 1b (first finishing processing). The cross-sectional surface 7a is irradiated with the EB 2b during the processing using the FIB 1b, and the SEM observation is performed.

Figure 5C:
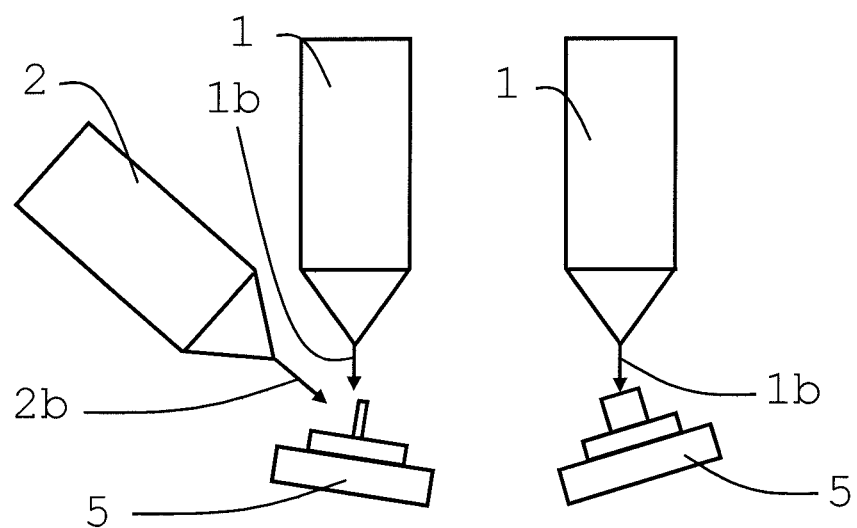
Figure 5D:
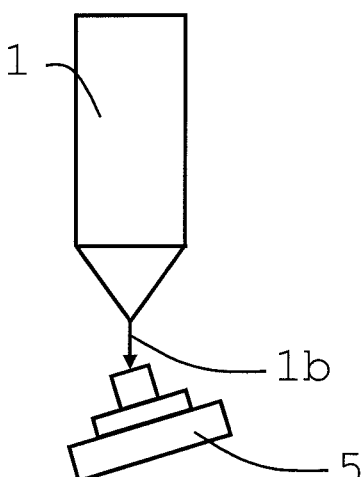

Then, the sample stage 5 is tilted about the second tilt axis 9a. FIG. 5C illustrates the arrangement of each column and the sample stage 5 on the second plane 22 after being tilted, and FIG. 5D illustrates the arrangement of each column and the sample stage 5 on the first plane 21 at this time. In a tilted state, the cross-sectional surface 7a is irradiated with the FIB 1b, and is subjected to the etching processing (second finishing processing). The cross-sectional surface 7a is observed by using the SEM observation during the processing using the FIB 1b, and the processing is completed when a desired structure or a defect is exposed to the cross-sectional surface 7a. Since the acceleration voltage is lowered during the finishing processing, it is possible to perform the processing having less damage.

Incidentally, it is also possible to perform the finishing processing by arranging to replace the FIB column 1 with the EB column 2 and using gas-assisted etching using the EB 1b instead of the processing using FIB 1b. According to this configuration, ion sputtering does not occur, thereby enabling the processing having less damage. However, in this case, the SEM observation is not performed during the processing.

Figure 6A:
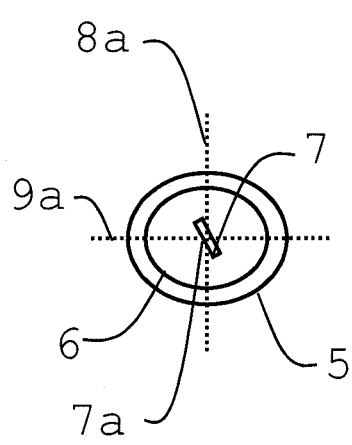
Figure 6B:
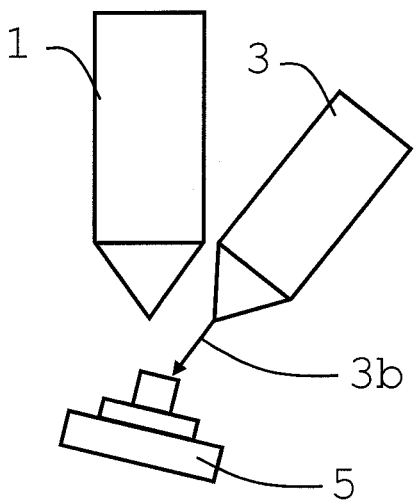

It has been described a case where the cross-sectional surface 7a is arranged so that the film thickness direction 7b of the thin sample 7 is orthogonal to the first tilt axis 8a. However, even when the film thickness direction 7b of the thin sample 7 and the first tilt axis 8a are not orthogonal to each other as illustrated in FIGS. 6A to 6D, it is possible to suppress the curtain effect in such a manner that the cross-sectional surface 7a is irradiated with the GIB 3b from two or more different directions. FIG. 6A illustrates the arrangement of the thin sample 7 on the sample stage 5 when viewed from the irradiation direction of the FIB 1b. The film thickness direction 7b of the thin sample 7 is tilted with respect to the first tilt axis 8a. FIG. 6B illustrates the arrangement of each column and the sample stage 5 on the first plane 21 at this time. Then, the cross-sectional surface 7a is irradiated with the GIB 3b and is subjected to the etching processing (first finishing processing). At this time, the cross-sectional surface 7a is irradiated with the EB 2b, and the SEM observation is performed.

Figure 6C:
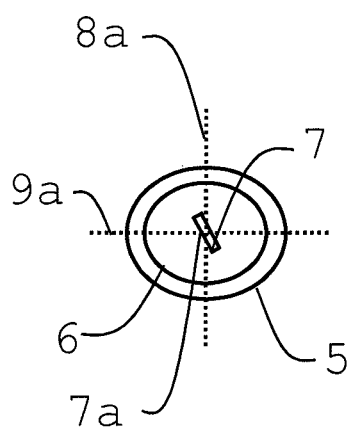
Figure 6D:
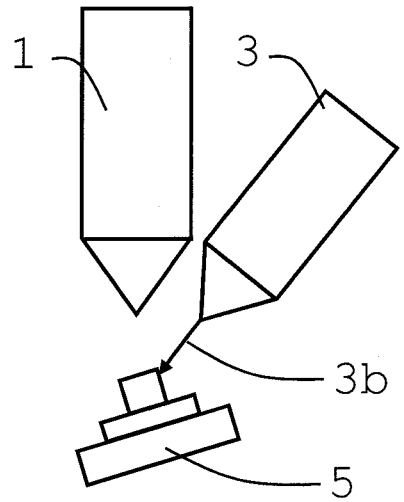

Then, the sample stage 5 is tilted about the second tilt axis 9a. FIG. 6C illustrates the arrangement of the sample stage 5 on the second plane 22 after being tilted, when viewed from the irradiation direction of the FIB 1b, and FIG. 6D illustrates the arrangement of each column and the sample stage 5 on the first plane 21 at this time. Since the sample stage 5 is tilted about the second tilt axis 9a, only the arrangement on the first plane 21 is changed. In a tilted state, the cross-sectional surface 7a is irradiated with the GIB 3b and is subjected to the etching processing (second finishing processing). Since the cross-sectional surface 7a may be irradiated with the GIB 3b from the different direction, it is possible to suppress the convex-concave portions from being formed due to the structure of the device which is exposed on the cross-sectional surface 7a. In addition, since the film thickness direction 7b is tilted with respect to the first tilt axis 8a, the GIB irradiation axis 3a is tilted with respect to the cross-sectional surface 7a, and the etching rate of the cross-sectional surface 7a is increased compared to a case where the GIB irradiation axis 3a is located in an in-plane direction of the cross-sectional surface 7a. Therefore, it is possible to shorten processing time by arranging the thin sample 7 in this manner.

Second Exemplary Embodiment

An exemplary embodiment will be described in which the thin sample 7 is processed by using the composite charged particle beam apparatus provided with a tilt sample holder 61 instead of the above-described second tilt mechanism.

In the composite charged particle beam apparatus without the second tilt mechanism, it is not possible to change the azimuth angle of the GIB 3b which is incident on the upper surface 7c of the thin sample 7, only by tilting the thin sample 7 about the first tilt axis 8a. Therefore, it is adopted a configuration where a sample fixing surface 61a is provided which is tilted at a constant angle with respect to a sample installation surface 5a of the sample stage 5, the attachable and detachable tilt sample holder 61 is installed, and the sample stage 5 is tilted about the first tilt axis 8a in a state where the thin sample 7 is fixed to the tilt sample holder 61. In this manner, it is possible to perform the finishing processing by irradiating the cross-sectional surface 7a with the GIB 3b from two or more different directions from the upper surface 7c of the thin sample 7.

Figure 7:
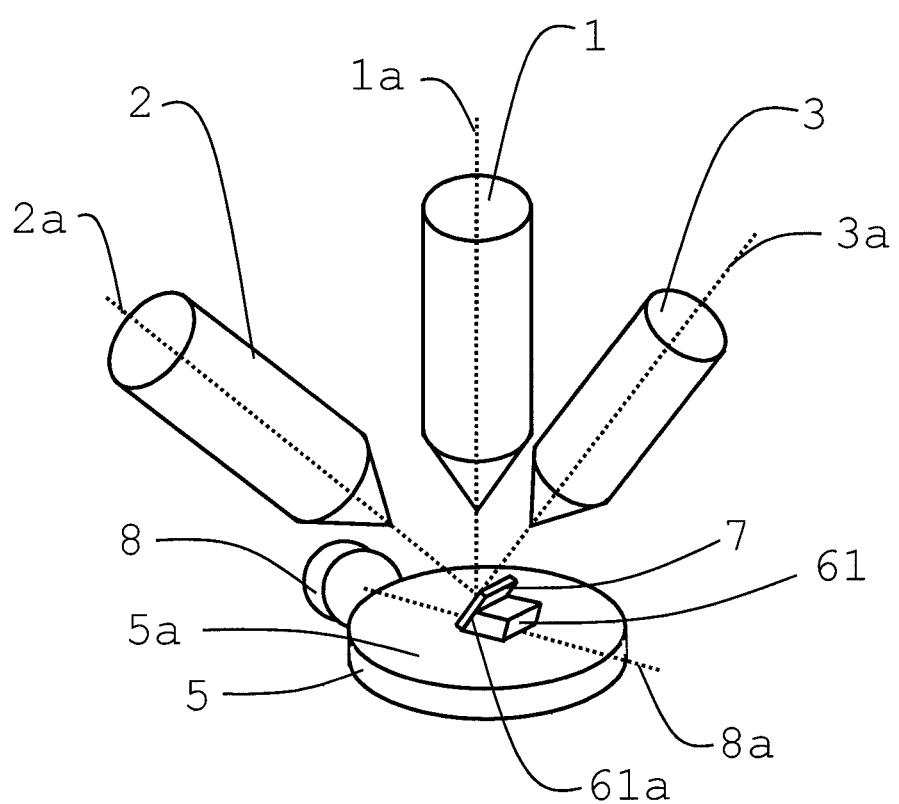
FIG. 7 is a configuration view of a composite charged particle beam apparatus of a second exemplary embodiment.

First, the thin sample 7 is fixed to the sample installation surface 5a of the sample stage 5, and the cross-sectional surface 7a is formed by using the FIB 1b. Then, the thin sample 7 is removed and the tilt sample holder 61 is installed on the sample installation surface 5a. Then, as illustrated in FIG. 7, the thin sample 7 is fixed to the sample fixing surface 61a of the tilt sample holder 61 in a direction where the GIB 3b may be incident on the cross-sectional surface 7a.

Figure 8A:
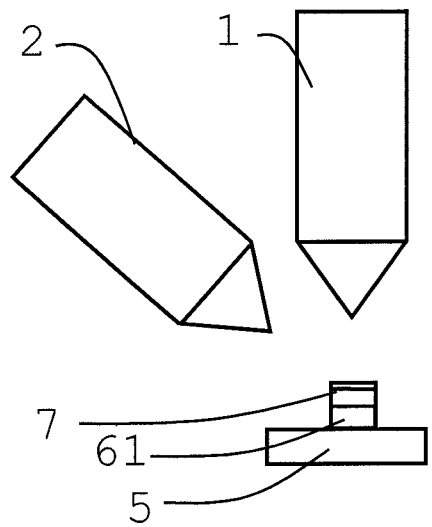
Figure 8B:
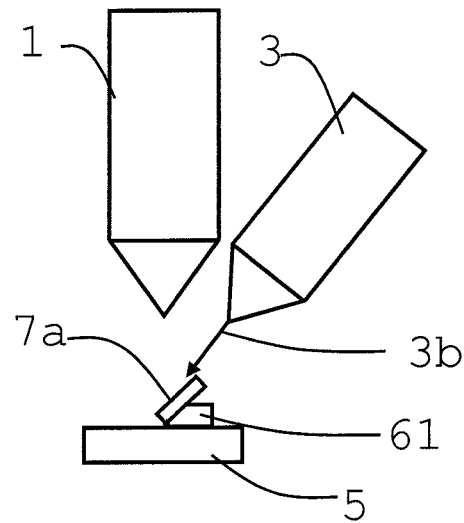

FIG. 8A illustrates the arrangement of each column and the sample stage 5 on the second plane 22. FIG. 8B illustrates the arrangement of each column and the sample stage 5 on the first plane 21 at this time. The tilt sample holder 61 tilts and fixes the thin sample 7 so that an angle enabling the GIB 3b to be incident on the cross-sectional surface 7a, that is, an angle of the cross-sectional surface 7a with respect to a horizontal plane becomes smaller than an angle of the GIB irradiation axis 3a with respect to the horizontal plane. In this state, the cross-sectional surface 7a is irradiated with the GIB 3b, and the etching processing is performed (first finishing processing).

Figure 8C:
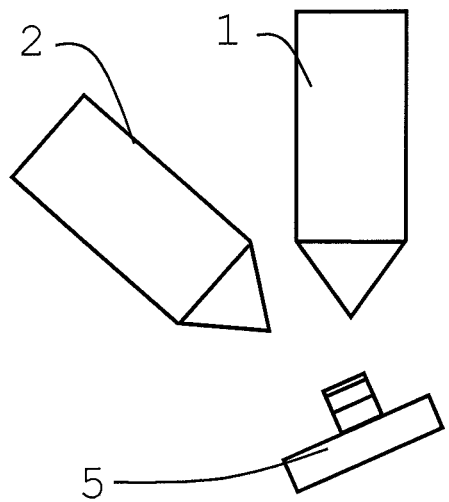
Figure 8D:
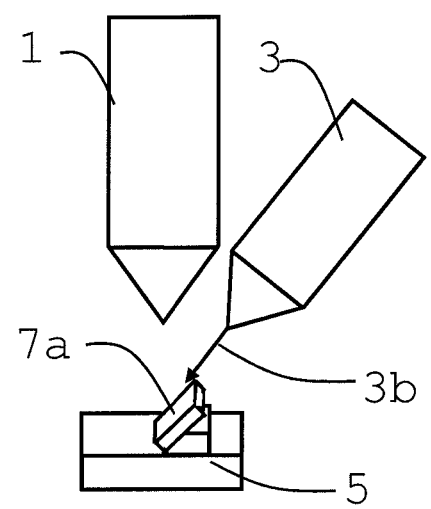

Then, the sample stage 5 is tilted about the first tilt axis 8a. FIG. 8C illustrates the arrangement of each column and the sample stage 5 on the second plane 22 after being tilted. FIG. 8D illustrates the arrangement of each column and the sample stage 5 on the first plane 21 at this time. It is possible to change the azimuth angle where the GIB 3b is incident on the cross-sectional surface 7a from the upper surface 7c side of the thin sample 7, by tilting the sample stage 5 about the first tilt axis 8a. In this state, the cross-sectional surface 7a is irradiated with the GIB 3b, and the etching processing is performed (second finishing processing). In this manner, even in the device which is not provided with the second tilt mechanism, the cross-sectional surface 7a may be irradiated with the GIB 3b from two or more different directions. Thus, it is possible to suppress the convex-concave portions from being formed due to the structure of the device which is exposed on the cross-sectional surface 7a.

Incidentally, the FIB column 1 and the EB column 2 may be arranged to be replaced with each other. In this case, the cross-sectional surface 7a during the etching processing using the GIB 3b may be observed by using the SEM observation.

Figure 9A:
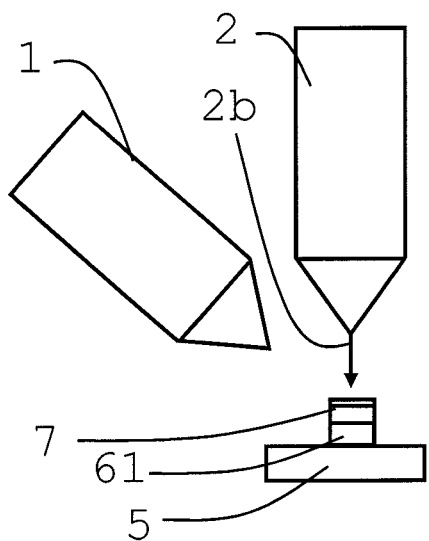
Figure 9B:
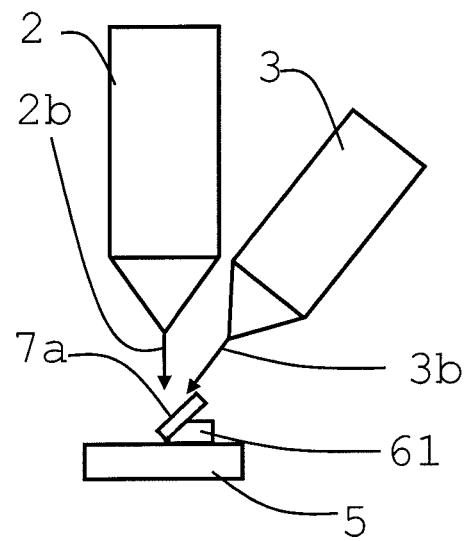

FIG. 9A illustrates the arrangement of each column and the sample stage 5 on the second plane 22. FIG. 9B illustrates the arrangement of each column and the sample stage 5 on the first plane 21 at this time. Since the cross-sectional surface 7a may be irradiated with the EB 2b, the cross-sectional surface 7a may be observed by using the SEM observation even during the processing using the GIB 3b.

Figure 9C:
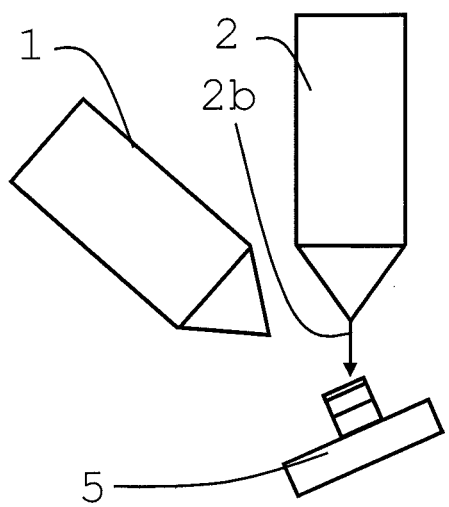
Figure 9D:
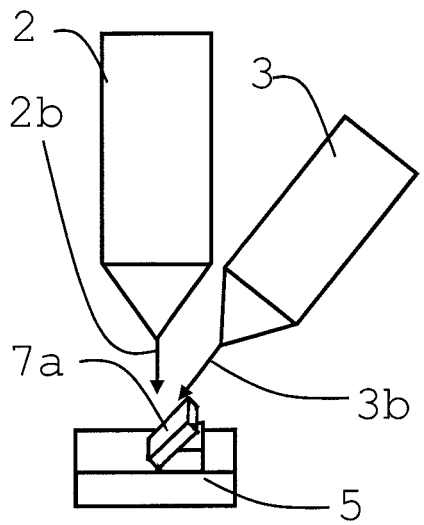

FIG. 9C illustrates the arrangement of each column and the sample stage 5 on the second plane 22 after being tilted. FIG. 9D illustrates the arrangement of each column and the sample stage 5 on the first plane 21 at this time. Since the cross-sectional surface 7a may be irradiated with the EB 2b even in the state, the cross-sectional surface 7a may be observed by using the SEM observation even during the processing using GIB 3b. The incidence angle of the EB 2b with respect to the cross-sectional surface 7a is not changed before and after being tilted. Accordingly, even in high magnification SEM observation for observing a fine device structure or defect as an observation object, it is not necessary to adjust a position for the SEM observation before and after being tilted, and thus, it is possible to efficiently perform the processing.

Third Exemplary Embodiment

Additional exemplary embodiment in which the thin sample 7 is processed by using the composite charged particle beam apparatus provided with the tilt sample holder 61 like the second exemplary embodiment will be described. In the present exemplary embodiment, the tilt sample holder 61 is used similarly to the second exemplary embodiment, but a rotary operation (rotation operation) is added in which the sample stage drive unit 10 (refer to FIG. 1) rotates the thin sample 7 in a plane during the processing.

Figure 10A:
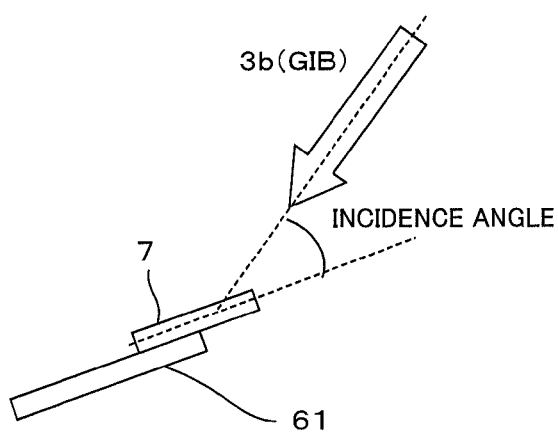
Figure 10B:
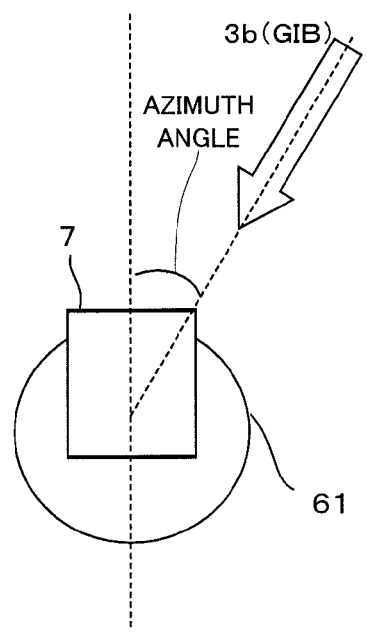

FIGS. 10A and 10B are explanatory views for defining an "incidence angle" and an "azimuth angle" which are applied to the present exemplary embodiment. FIG. 10A illustrates the incidence angle, which is an angle in which the GIB 3b is incident on the thin sample 7. Specifically, the incidence angle herein is an angle in a direction perpendicular to the exposed cross-sectional surface 7a of the thin sample 7.

On the other hand, FIG. 10B illustrates the "azimuth angle", and the azimuth angle may be changed by the above-described rotary operation. The "azimuth angle" in the first exemplary embodiment and the second exemplary embodiment has the similar meaning, but the azimuth angle in the first exemplary embodiment and the second exemplary embodiment varies in accordance with tilt of the sample stage 5. Similarly to the incidence angle, the azimuth angle is also the angle in which the GIB 3b is incident on the thin sample 7, but in particular, the azimuth angle is an angle in the in-plane direction with respect to the exposed cross-sectional surface 7a of the thin sample 7. A shape of the tilt sample holder 61 is different from the shapes illustrated in FIG. 7 to FIG. 9D, but the difference is made only in the drawings, and the shapes are substantially the same as each other.

Figure 11:
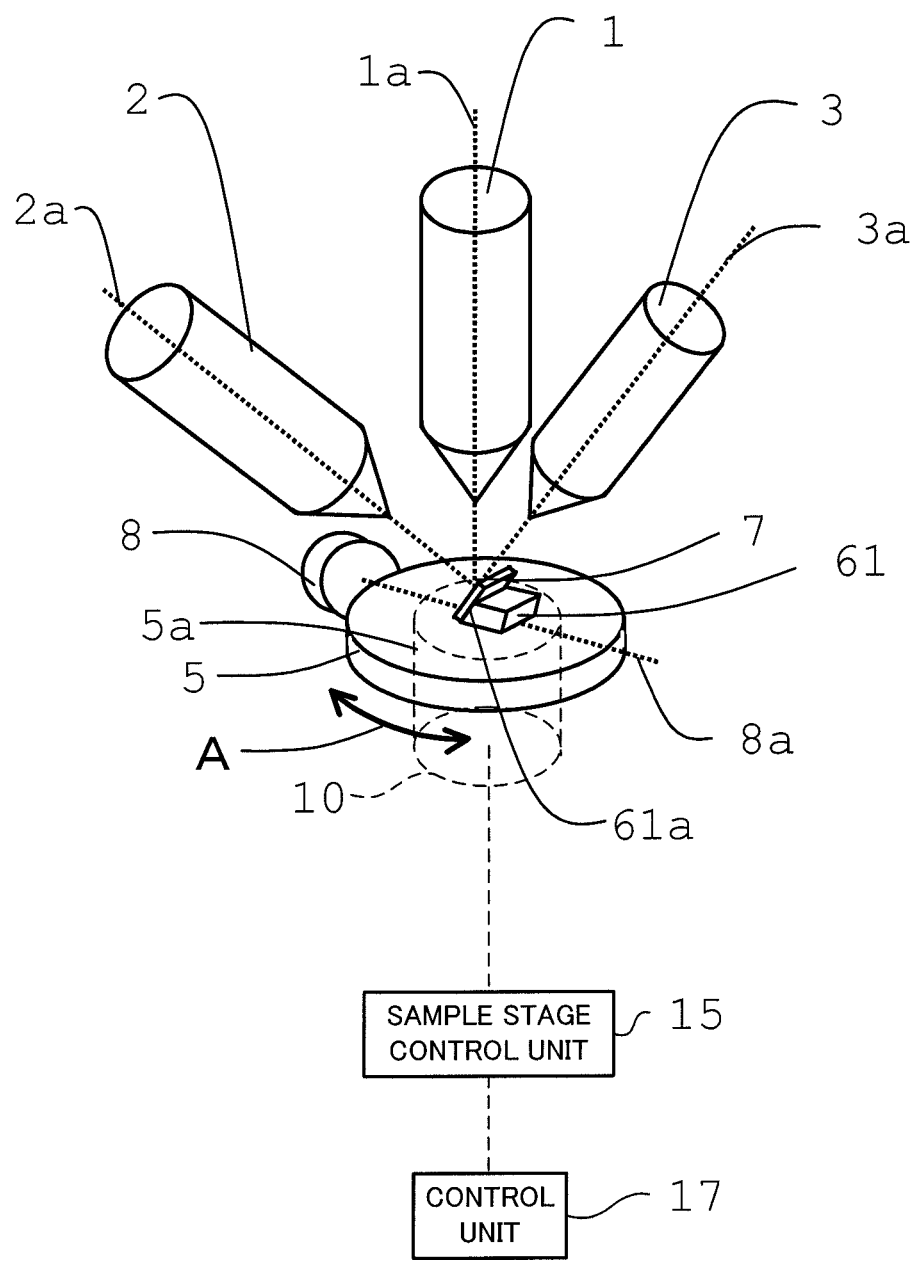
FIG. 11 is an explanatory view of a thin sample processing method of a third exemplary embodiment.

As illustrated in FIG. 11, even in the present exemplary embodiment, similarly to the first exemplary embodiment, the sample stage 5 is tilted about the first tilt axis 8a in a state where the sample fixing surface 61a is disposed which is tilted at a constant angle with respect to the sample installation surface 5a of the sample stage 5, the attachable and detachable tilt sample holder 61 is installed, and the thin sample 7 is fixed to the tilt sample holder 61.

Further, in the present exemplary embodiment, the sample stage drive unit 10 as a rotary mechanism is configured to drive the sample stage 5 under the control of the control unit 17 and further the sample stage control unit 15 (refer to FIG. 1), so as to rotate the sample stage 5 within a plane as illustrated in an arrow A. The sample stage drive unit 10 as the rotary mechanism may employ various ones such as a servo-motor, and the type is not particularly limited thereto.

Figure 12A:
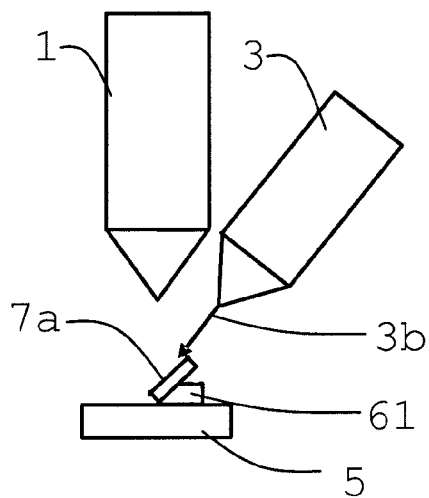
Figure 12B:
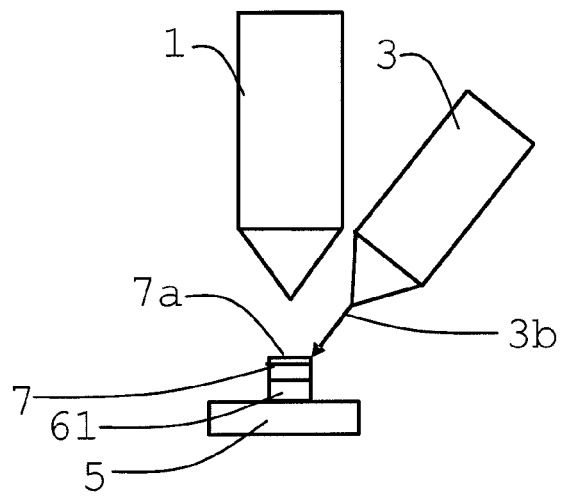

FIG. 12A illustrates the arrangement of each column and the sample stage 5 on the first plane 21 in the present exemplary embodiment, and is the same drawing as FIG. 8B. In this state, the cross-sectional surface 7a is irradiated with the GIB 3b, and the etching processing is performed. Thereafter, when the sample stage drive unit 10 is driven by a command of the control unit 17 (and the sample stage control unit 15) and the sample stage 5 is rotated by 90 degrees clockwise along the arrow A in FIG. 11, the state shown in FIG. 12A is changed to a state in FIG. 12B. In this state, the cross-sectional surface 7a is irradiated with the GIB 3b, and the etching processing is performed. In the drawing, a rotation angle of the sample stage 5 is 90 degrees, but is for illustrative purpose only, and the actual angle may be arbitrarily selected.

In the present exemplary embodiment, in addition to the operation of the second exemplary embodiment, since the cross-sectional surface 7a is irradiated with the GIB 3b in various directions with a changed azimuth angle, it is possible to more effectively suppress the convex-concave portions from being formed due to the structure of the device which is exposed on the cross-sectional surface 7a. Accordingly, the curtain effect is further suppressed from appearing.

Incidentally, in the present exemplary embodiment, an example has been described in which the azimuth angle of the GIB 3b is changed with respect to the thin sample 7, but the azimuth angle of the FIB 1b and the EB 2b may be changed with respect to the thin sample 7.

In addition, details such as a size of the tilt sample holder 61 and an attachment method of the thin sample 7 are not particularly limited, but the best one may be selected depending on the observation. In addition, it is also possible to change the incidence angle with respect to the thin sample 7 by replacing various tilt sample holders 61. In addition, both of a front surface and a rear surface may be processed by replacing the front surface and the rear surface of the thin sample 7.

Fourth Exemplary Embodiment

The present exemplary embodiment will describe an automatic processing program (automatic sequence recipe) configured to drive the composite charged particle beam apparatus on the basis of a setting input by an operator. The setting includes, for example, the above-described incidence angle, azimuth angles, an irradiation period of time of the beam (irradiation amount) in each azimuth angle, and the presence or absence of SEM monitoring. As described above, the operator sets an irradiation region of the FIB or the GIB, on the basis of a pre-set menu or the observation images such as the SEM image or the SIM image, which are displayed on the display unit 18. The operator inputs a processing frame for setting the irradiation region on the observation image displayed on the display unit 18, to the input unit 16. In response to the operator inputting conditions relating to the device control to the input unit 16, the control unit 17 receives the input conditions and transmits the irradiation region and the control signal to start the processing to the FIB control unit 11 or the GIB control unit 13, so that the specified irradiation region of the thin sample 7 is irradiated with the FIB from the FIB control unit 11 or with the GIB from the GIB control unit 13. In this manner, the irradiation region input by the operator can be irradiated with the FIB or the GIB.

Figure 13:
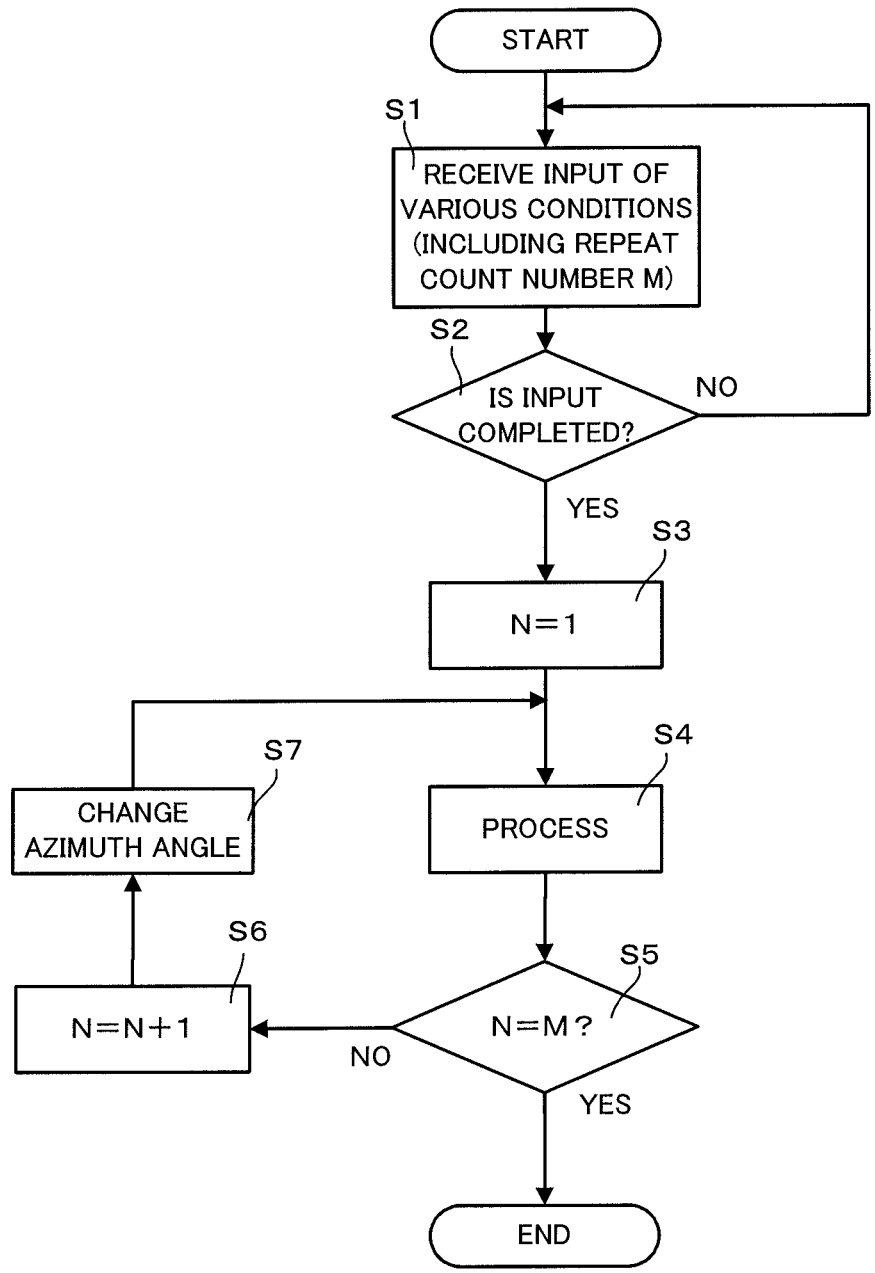
FIG. 13 is a flowchart of a thin sample processing method of a fourth exemplary embodiment.

FIG. 13 is a flowchart of a thin sample processing method. First, the operator inputs various conditions relating to the device control to the input unit 16, on the basis of a pre-set menu (Step S1). In addition, on the basis of the observation images such as the SEM image or the SIM image, which are displayed on the display unit 18, the operator can input various new conditions relating to the device control to the input unit 16. The various conditions include the following (1) to (4) for example, and are registered in a memory (not illustrated). In response to receiving the input, the control unit 17 sends the control signal corresponding to the input to each unit of the following.

(1) Basic Parameters
Observation Conditions (SEM observation position, acceleration voltage, visual field size, scanning speed, presence or absence of SEM observation after processing, and the like) . . . FIB control unit 11, EB control unit 12
Irradiation Conditions of GIB (irradiation period of time, presence or absence of scanning, and the like) . . . GIB control unit 13
Reference Position of Sample stage 5 in Azimuth Angle of Zero Degree . . . Sample stage control unit 15
Switch/Combination of Detector during SEM Observation (selection of detector, presence or absence of synthesis of images from each detector, change of image synthesis ratio of the image . . . Image Formation Unit 14

(2) Creating Sequence
Creating a sequence based on the conditions such as the azimuth angle, the irradiation period of time, and the presence or absence of the SEM observation after the processing.

(3) Changing Sequence
Changing the sequence based on the conditions such as the azimuth angle, the irradiation period of time, and the presence or absence of the SEM observation after the processing.

(4) Confirmation and Modification of Registered Coordinates

The various conditions are not limited to above-described conditions. Here, the various conditions include setting of a total count number M by which the azimuth angle is changed to repeat the processing (repeat count number M). The operator can input the total count number to the input unit 16. However, in a case where all the azimuth angles (angle for rotating the sample stage 5) are fixed from the beginning, the repeat counter number is automatically determined by inputting a size of the azimuth angle to be changed after single processing. Accordingly, the size of the azimuth angle to be changed may be input. For example, when the sample stage 5 is rotated over 360 degrees, if 30 degrees are input as the size of the azimuth angle to be changed after the single processing, the repeat counter number M is automatically determined as 12 times (=360÷12) and is stored in the memory. When the azimuth angle is set, on the basis of the coordinate of the azimuth angle of zero degree, each coordinate in each azimuth angle is automatically calculated.

When the control unit 17 determines that the input is completed (Step S2: Yes), since the repeat count number is one at first, the control unit 17 registers "N=1" to the memory (Step S3), generates a control signal to start the processing and the control signal of the irradiation region in the associated azimuth angle, and sends the control signal to each unit to start the processing (Step S4).

After the processing is completed at the associated azimuth angle, the control unit 17 determines whether or not the processing at the associated azimuth angle reaches the required repeat counter number M. In a case where the processing has reached the number (N=M) (Step S5: Yes), the control unit 17 completes the operation. On the other hand, in a case where the processing has not reached the number (Step S5: No), the control unit 17 further increases the processing number by one, that is, registers "N=N+1" to the memory (Step S6), changes the azimuth angle (Step S7), and returns to Step S4 to perform the subsequent processing. In a case of "N=M", the control unit 17 completes the operation (Step S5: Yes).

It has been described the example where the processing from all the azimuth angles is automatically performed on the basis of the azimuth angle that has been set in advance. However, the present invention is not limited thereto. For example, it may be possible to observe an image, etc., per one process and perform a new process from a new azimuth angle. Further, a degree of change of the azimuth angle may not be necessarily to be constant. It may be possible to change the azimuth angle from 30 degrees to 60 degrees, for example, during the processing.

That is, it is possible for the operator to create a plurality of desired sequences and register the same to the composite charged particle beam apparatus in advance, and to control the apparatus implement the sequence. For example, as a first sequence, a sequence in which the azimuth angle is 30 degrees, processing is performed for 10 minutes, and no SEM observation is performed after the processing may be registered for a rough processing. Also, as a second sequence, a sequence in which the azimuth angle is 10 degrees, processing is performed for 5 minutes, and SEM observation is performed after the processing may be registered for a finishing processing. According thereto, by controlling the composite charged particle beam apparatus to perform the processing according to the registered sequences, it becomes possible to perform the processing for a plurality of samples with a constant quality.

The present invention is not limited to the above-described exemplary embodiments, but may be appropriately modified and improved. In addition, materials, shapes, dimensions, numerical values, forms, numbers and arrangement places of each of configuring elements in the above-described exemplary embodiments may be arbitrarily selected and have no limitation, as long as the conditions can achieve the present invention.

What is claimed is:

1. A composite charged particle beam apparatus, comprising:
   a first charged particle beam column configured to irradiate a thin sample with a first charged particle beam;
   a second charged particle beam column configured to irradiate an irradiation position of the first charged particle beam of the thin sample with a second charged particle beam;
   a sample stage on which the thin sample is placed, the sample stage being rotatable about the irradiation axis of the first charged particle beam column;
   a tilt unit configured to tilt the thin sample about a tilt axis of the sample stage, the tilt axis being orthogonal to the irradiation axis of the first charged particle beam column and being located inside a plane formed by the irradiation axis of the first charged particle beam column and the irradiation axis of the second charged particle beam column; and
   a tilt sample holder placed on the sample stage and configured to fix the thin sample such that a cross-sectional surface of the thin sample is tilted at a constant angle with respect to the irradiation axis of the second charged particle beam column and the azimuth angle of the second charged particle beam column can be changed by rotation of the sample stage.

2. The composite charged particle beam apparatus according to claim 1, wherein the tilt sample holder is attachable to and detachable from the sample stage.

3. The composite charged particle beam apparatus according to claim 1, further comprising:
   a display unit configured to display an operation condition and an observation image of the thin sample;
   an input unit configured to allow an operator to input information about the operation condition; and
   a control unit configured to control the composite charged particle beam apparatus on the basis of the information input to the input unit.

4. A thin sample processing method comprising:
   fixing a thin sample to a tilt sample holder mounted on a rotatable sample stage;
   forming across-sectional surface on the thin sample by irradiating the thin sample with a first charged particle beam;
   performing first finishing processing by irradiating the cross-sectional surface with a second charged particle beam from an upper surface side of the thin sample;
   tilting the thin sample about a tilt axis of the sample stage by rotating the sample stage to change the azimuth angle of the second charged particle beam, the tilt axis being orthogonal to an irradiation axis of the first charged particle beam and being located inside a plane formed by the irradiation axis of the first charged particle beam and an irradiation axis of the second charged particle beam; and
   performing second finishing processing by irradiating the cross-sectional surface with the second charged particle beam from the upper surface side after the thin sample is tilted.

5. The thin sample processing method according to claim 4, further comprising:
   observing the cross-sectional surface by using SEM observation during the performing the first finishing processing and the second finishing processing.

* * * * *